United States Patent
Ueda et al.

(10) Patent No.: US 11,553,601 B2
(45) Date of Patent: Jan. 10, 2023

(54) WIRING BOARD AND METHOD FOR MANUFACTURING THE SAME

(71) Applicant: IBIDEN CO., LTD., Gifu (JP)

(72) Inventors: Kazuyuki Ueda, Ogaki (JP); Shota Tachibana, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/080,927

(22) Filed: Oct. 27, 2020

(65) Prior Publication Data
US 2021/0136929 A1    May 6, 2021

(30) Foreign Application Priority Data

Nov. 1, 2019   (JP) .............................. JP2019-200152

(51) Int. Cl.
| | |
|---|---|
| H05K 1/11 | (2006.01) |
| H05K 3/46 | (2006.01) |
| H05K 3/00 | (2006.01) |
| H05K 3/10 | (2006.01) |

(52) U.S. Cl.
CPC ............ *H05K 3/4626* (2013.01); *H05K 1/111* (2013.01); *H05K 3/0041* (2013.01); *H05K 3/107* (2013.01); *H05K 3/4682* (2013.01); *H05K 2201/10674* (2013.01)

(58) Field of Classification Search
CPC .................................................. H05K 3/4626
USPC ........................................................ 174/262
See application file for complete search history.

(56) References Cited

U.S. PATENT DOCUMENTS

| | | | | |
|---|---|---|---|---|
| 2010/0078791 | A1* | 4/2010 | Yim | .................... H01L 25/0655 257/686 |
| 2020/0381383 | A1* | 12/2020 | Hsu | ..................... H01L 21/4857 |
| 2021/0119177 | A1* | 4/2021 | Bang | ..................... G06F 3/0446 |

FOREIGN PATENT DOCUMENTS

JP   2010-118634 A   5/2010

* cited by examiner

*Primary Examiner* — Stanley Tso
(74) *Attorney, Agent, or Firm* — Oblon, McClelland, Maier & Neustadt, L.L.P.

(57) ABSTRACT

A wiring board includes a resin insulating layer having a component mounting surface, first connection pads formed on the component mounting surface of the resin insulating layer, second connection pads formed on the component mounting surface of the resin insulating layer such that the second connection pads are surrounding the first connection pads, and a protruding part including a metal material and formed on the component mounting surface of the resin insulating layer such that a portion of the protruding part is embedded in the resin insulating layer and that the protruding part is positioned between the first connection pads and the second connection pads and surrounding the first connection pads.

20 Claims, 9 Drawing Sheets

WIRING BOARD AND METHOD FOR MANUFACTURING THE SAME

CROSS-REFERENCE TO RELATED APPLICATIONS

The present application is based upon and claims the benefit of priority to Japanese Patent Application No. 2019-200152, filed Nov. 1, 2019, the entire contents of which are incorporated herein by reference.

BACKGROUND OF THE INVENTION

Field of the Invention

The present invention relates to a wiring board and a method for manufacturing the wiring board.

Description of Background Art

Japanese Patent Application Laid-Open Publication No. 2010-118634 describes a printed substrate having a flow prevention dam and a method for manufacturing the printed substrate. An underfill flow prevention dam is formed by a dry film resist on an outer edge of a region where solder pads of the substrate are formed. The entire contents of this publication are incorporated herein by reference.

SUMMARY OF THE INVENTION

According to one aspect of the present invention, a wiring board includes a resin insulating layer having a component mounting surface, first connection pads formed on the component mounting surface of the resin insulating layer, second connection pads formed on the component mounting surface of the resin insulating layer such that the second connection pads are surrounding the first connection pads, and a protruding part including a metal material and formed on the component mounting surface of the resin insulating layer such that a portion of the protruding part is embedded in the resin insulating layer and that the protruding part is positioned between the first connection pads and the second connection pads and surrounding the first connection pads.

According to another aspect of the present invention, a method for manufacturing a wiring board includes preparing a support plate including a metal foil, forming, on the metal foil of the support plate, a conductor layer including first connection pads, second connection pads and a protruding part, laminating a resin insulating layer on the conductor layer such that a laminate including the conductor layer and the resin insulating layer is formed on the support plate, removing the support plate from the conductor layer of the laminate, and removing a portion of the resin insulating layer such that the first connection pads, the second connection pads and the protruding part protrude from a surface of the resin insulating layer. The forming of the conductor layer includes forming the protruding part between the first connection pads and the second connection pads such that the protruding part surrounds the first connection pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
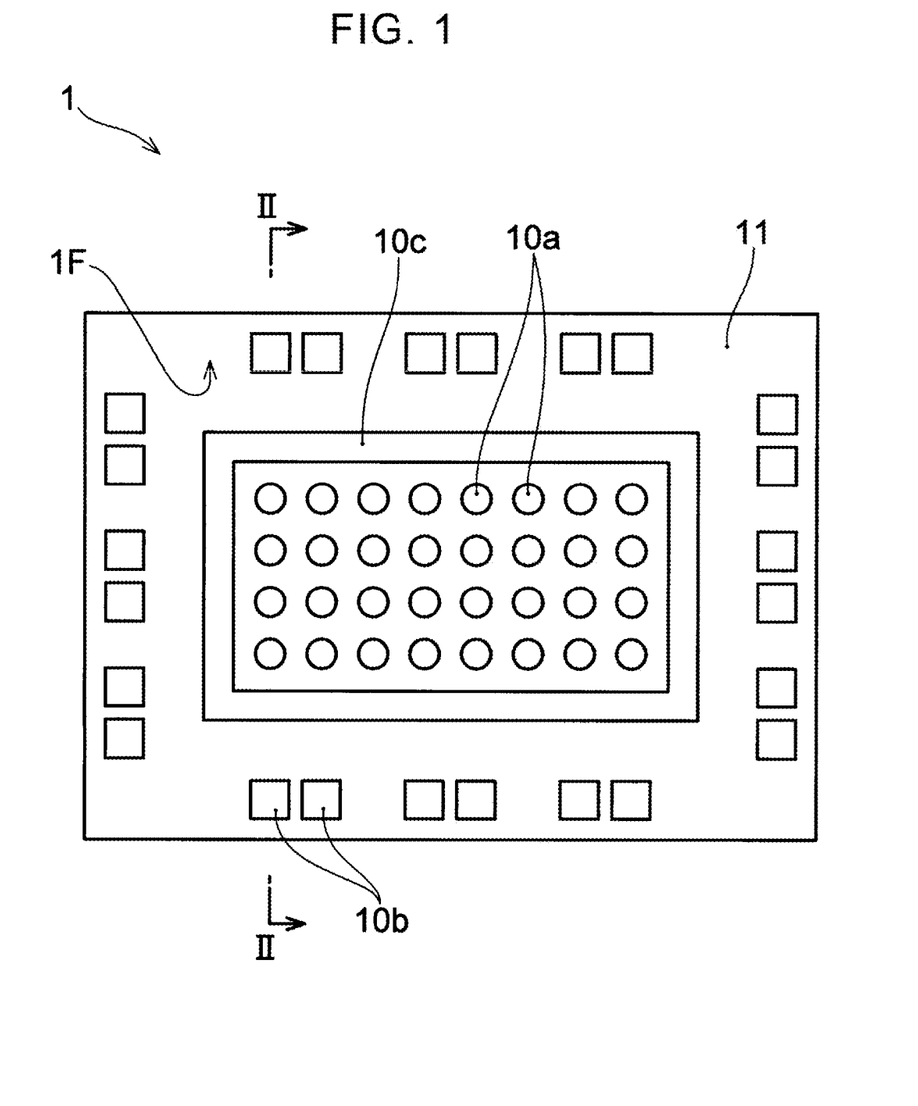
FIG. 1 is a top view illustrating an example of a wiring board of an embodiment of the present invention.
Figure 2:
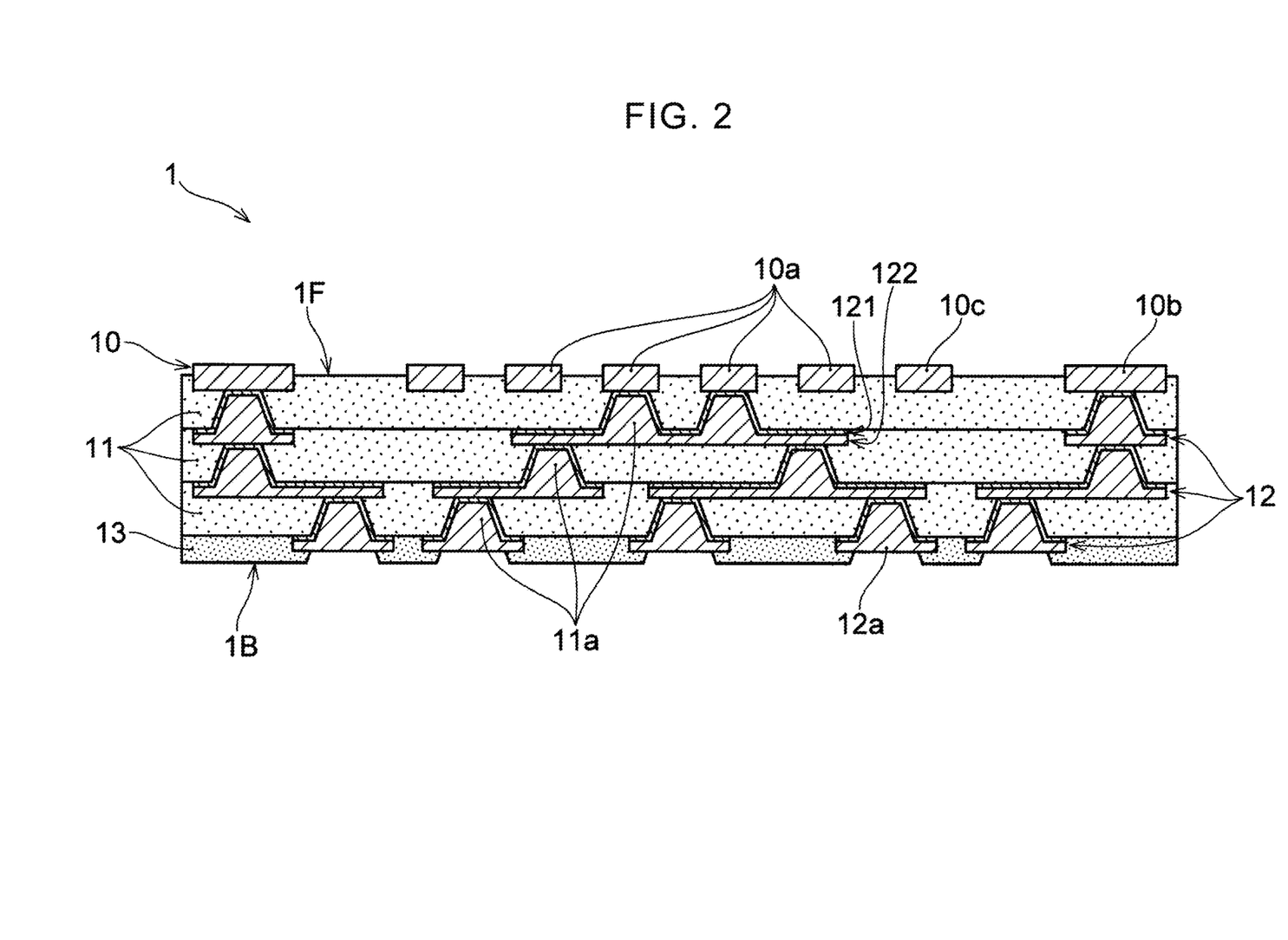
FIG. 2 is a cross-sectional view along a II-II line of the wiring board illustrated in FIG. 1.

A wiring board of an embodiment of the present invention is described with reference to the drawings. FIG. 1 illustrates a plan view of a wiring board 1 which is an example of the wiring board. FIG. 2 illustrates a cross-sectional view along a II-II line of the wiring board 1 illustrated in FIG. 1.

The wiring board 1 is formed by alternately laminating insulating layers and conductor layers, and has a first surface (1F) and a second surface (1B), which is on an opposite side with respect to the first surface (1F). The first surface (1F) of the wiring board 1 is formed by a resin insulating layer 11, which is exposed on one side in a lamination direction, and a first conductor layer 10, which is partially exposed from the resin insulating layer 11. The second surface (1B) of the wiring board 1 is formed by a covering layer 13, which is exposed on the other side in the lamination direction, and a second conductor layer 12.

The first surface (1F) is formed as a component mounting surface on which external electronic components are mounted. The first conductor layer 10 that forms the first surface (1F) includes first connection pads (10a), second connection pads (10b), and a first protruding part (10c). As illustrated in the plan view of FIG. 1, the first protruding part (10c) is formed so as to surround a region where the first connection pads (10a) are formed, and the second connection pads (10b) are formed on an outer side of the first protruding part (10c) (peripheral edge side of the wiring board 1). On the first connection pads (10a), for example, a semiconductor IC chip, which is an external electronic component, is flip-chip mounted via solder bumps or the like. Another electronic component is connected to the second connection pads (10b). For example, a package substrate arranged so as to straddle the semiconductor IC chip connected to the first connection pads (10a) can be connected via solder balls or the like.

In the example illustrated in FIG. 2, upper surfaces of the first connection pads (10a), the second connection pads (10b), and the first protruding part (10c), which form the first surface (1F), are formed at the same height relative to the resin insulating layer 11. In FIG. 1, the first protruding part (10c) is formed so as to surround, with a continuous frame shape, the region where the first connection pads (10a) are formed. However, it is also possible that the first protruding part (10c) is formed partially separated so as to surround the region where the first connection pads (10a) are formed.

On the second surface (1B) of the wiring board 1, third connection pads (12a) are formed by the second conductor layer 12 exposed from openings formed in the covering layer 13. The third connection pads (12a) can be used, for example, for connecting to a motherboard of an electronic device in which the wiring board 1 is used, or a package substrate of a semiconductor device having a laminated structure. In the wiring board 1 of the illustrated example, the covering layer 13 is formed as a solder resist layer.

The wiring board has one or two or more resin insulating layers 11, and, one or two or more second conductor layers 12. In the example illustrated in FIGS. 1 and 2, the wiring board 1 has three resin insulating layers 11 and three second conductor layers 12. The number of the resin insulating layers 11 and the number of the second conductor layers 12 can be increased or decreased as appropriate. The wiring board 1 may include more than three second conductor layers. By including more conductor layers in the wiring board 1, a larger and more complicated electric circuit can be formed in the wiring board 1 without increasing a planar size of the wiring board 1.

In the resin insulating layers 11 of the wiring board 1, via conductors (11a) are formed to connect to each other the second conductor layers 12, or the second conductor layer 12 and the first conductor layer 10, which are formed sandwiching the resin insulating layers 11. The via conductors (11a) each have a tapered shape that is reduced in diameter toward the first surface (1F) side. For convenience, the term "reduced in diameter" is used. However, an opening shape of each of the via conductors (11a) is not necessarily limited to a circular shape. The term "reduced in diameter" simply means that a longest distance between two points on an outer circumference of a horizontal cross section of each of the via conductors (11a) is reduced.

The resin insulating layers 11 of the wiring board 1 can each be formed using any insulating resin such as an epoxy resin. A polyimide resin, a BT resin (bismaleimide-triazine resin), a polyphenylene ether resin, a phenol resin or the like can also be used. The resin insulating layers 11 may each contain inorganic filler such as silica. The wiring board 1 does not contain a core material, and has a form of a "coreless substrate" that does not include a supporting base material, unlike a wiring board manufactured by sequentially forming and stacking a required number of build-up layers on both sides or one side of a core substrate that contains a core material as a supporting base material. However, when necessary, the resin insulating layers 11 may each contains a core material such as a glass fiber or an aramid fiber. The three resin insulating layers 11 may be respectively formed of different materials, or may all be formed of the same material. All three resin insulating layers 11 are preferably formed of the same material in order to suppress peeling between the resin insulating layers 11.

The covering layer 13 can be formed using any insulating resin. The covering layer 13 is formed using, for example, a photosensitive polyimide resin or epoxy resin. The covering layer 13 can be a solder resist layer formed so as to cover edges of the third connection pads (12a). Wetting and spreading of a connection material such as solder supplied to the third connection pads (12a) can be suppressed, and defects due to short circuits between the third connection pads (12a) can be prevented. The openings exposing portions of the second conductor layer 12 can be formed using a photolithography technology.

The first conductor layer 10 and the second conductor layers 12 can each be formed using any material having an appropriate conductivity, such as copper or nickel. The first conductor layer 10 and the second conductor layers 12 are each formed by, for example, an electrolytic copper plating film or an electroless copper plating film, or a combination thereof. The first conductor layer 10 is formed of only one layer, preferably an electrolytic copper plating film. Further, the second conductor layers 12 are preferably each formed to have a two-layer structure including an electroless copper plating film layer 121 and an electrolytic copper plating film layer 122. However, the structure of each of the conductor layers is not limited to the single-layer structure or the multilayer structure illustrated in FIG. 2. For example, it may be formed of a three-layer structure including a copper foil, an electroless copper plating film layer, and an electrolytic copper plating film layer.

The via conductors (11a) are preferably each formed of an electroless copper plating film and an electrolytic copper plating film. As illustrated in FIG. 2, the via conductors (11a) can be integrally formed with the electroless copper plating film and the electrolytic copper plating film that form the second conductor layers 12.

As described above, the first protruding part (10c) is formed between the region where the first connection pads (10a) are formed and the region where the second connection pads (10b) are formed, in a manner surrounding the region where the first connection pads (10a) are formed. For example, when an electronic component such as a semiconductor IC chip is flip-chip mounted on the first connection pads (10a), the first protruding part (10c) can function as a dam that prevents an underfill material or the like filled between the electronic component and the first surface (1F) of the wiring board 1 from flowing and spreading around.

When an electronic component such as a semiconductor IC chip is connected to the connection pads via solder bumps or the like by flip-chip mounting, at a bottom of the electronic component (a gap between the wiring board and the electronic component), in order to stabilize the connection, a flowable underfill material is filled and solidified. When the underfill material flows to an outer side of a region where the electronic component is mounted, the underfill material can adhere to connection pads where another electronic component is mounted and cause a connection failure. In particular, when the flowability of the underfill material is increased in order to reliably fill the gap between the wiring board and the electronic component, the risk that a connection failure may occur is high. The first protruding part (10c) prevents such an underfill material from flowing to an outer side of the region where the electronic component is mounted by flip-chip mounting.

The first protruding part (10c) is formed as a part of the first conductor layer 10 using the same conductive material (metal material) at the same time as the first connection pads (10a) and second connection pads (10b). As compared to a case where a dam preventing an underfill material from spreading is formed with a resin material (for example, the same material as the resin insulating layers 11), a higher rigidity can be achieved, and occurrence of a defect such as a crack that may occur due to thermal expansion or contraction associated with solidification or the like of the adhered underfill material can be suppressed. Further, a surface of a resin material is generally highly hydrophobic (highly lipophilic) so it is easy for an underfill material to wet and spread, and thus, there is a risk that the underfill material cannot be dammed by the dam and the underfill material flows out of the dam. A metal material is relatively highly hydrophilic (highly lipophobic) than a resin material, and is likely to repel the underfill material. The underfill material can be more effectively dammed, and the spreading thereof can be more effectively prevented. A highly flowabe underfill material can be used, and the gap between the electronic component and the wiring board 1 can be more reliably filled with the underfill material to stabilize the connection.

Figure 3:
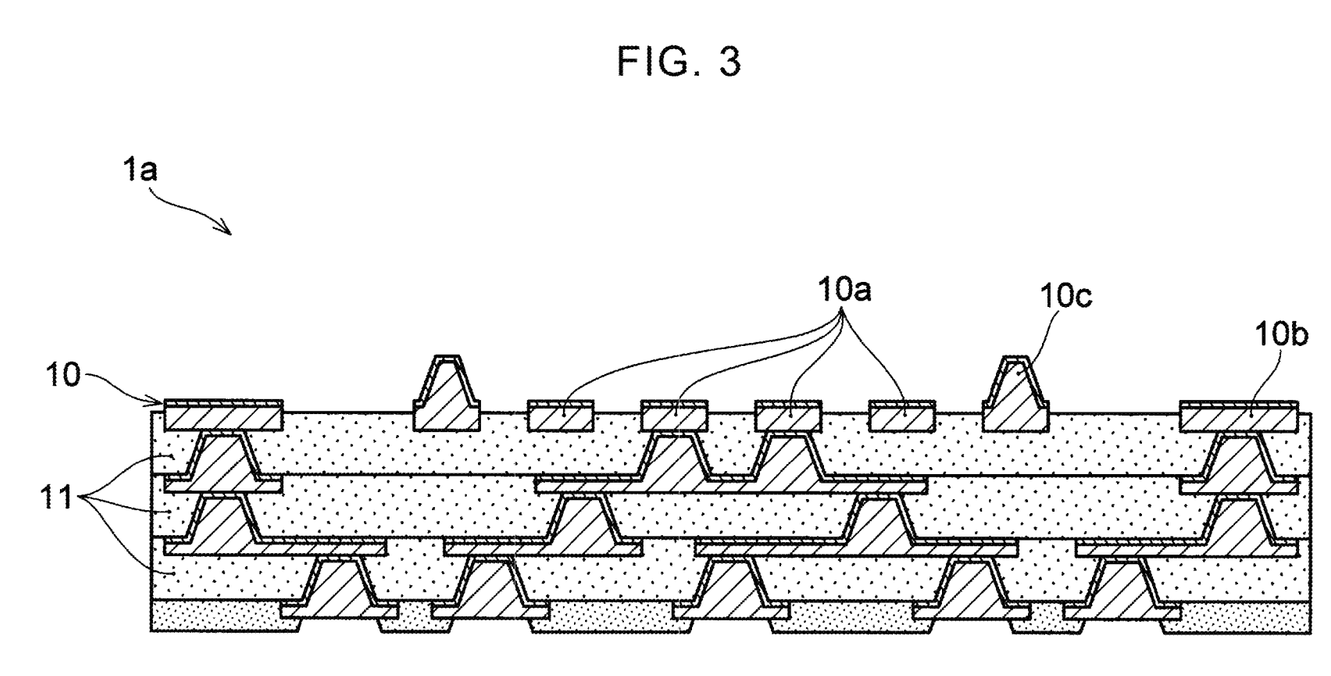
FIG. 3 is a cross-sectional view illustrating another example of the wiring board illustrated in FIG. 2.

In the wiring board 1 illustrated in FIG. 2, the upper surfaces of the first connection pads (10a), the second connection pads (10b) and the first protruding part (10c), which form the first surface (1F), are formed at the same height relative to the resin insulating layer 11. However, it is also possible that the upper surface of the first protruding part (10c) is formed higher than the upper surfaces of the first connection pads (10a) and the second connection pads (10b). FIG. 3 illustrates a wiring board (1a) in which the height of the upper surface of the first protruding part (10c) relative to the resin insulating layer 11 is higher than that of the upper surfaces of the first and second connection pads (10a, 10b). By increasing the height of the upper surface of the first protruding part (10c), the underfill material can be more effectively dammed. In the wiring board (1a), the first protruding part (10c) has a shape that tapers toward a front end side (upper surface side). However, it is also possible that the first protruding part (10c) is formed in a shape having substantially the same width. In the wiring board (1a) illustrated in FIG. 3, the first connection pads (10a), the second connection pads (10b), and the first protruding part (10c) are each formed to have, for example, a two-layer conductor structure including an electroless copper plating film layer and an electrolytic copper plating film layer.

Figure 4:
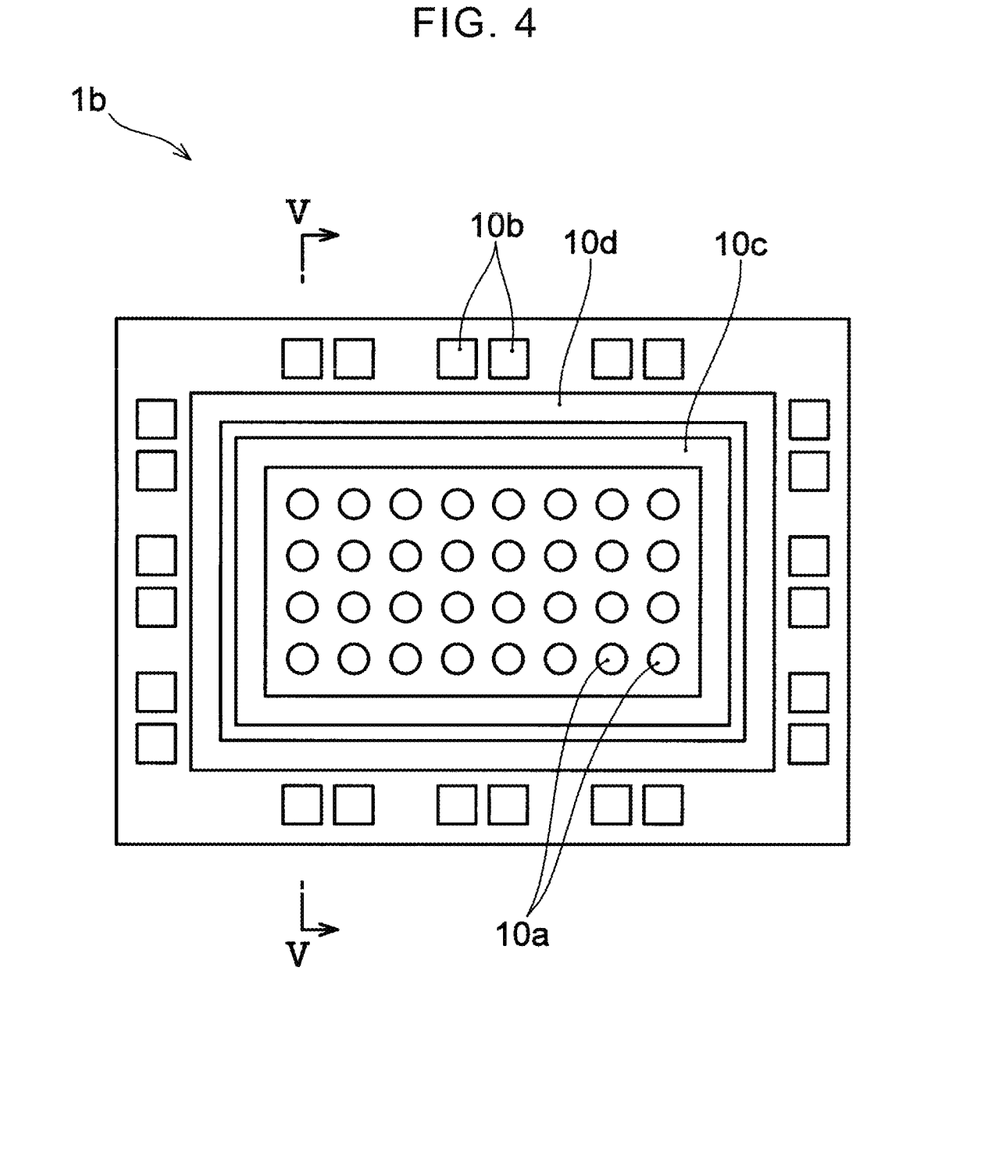
FIG. 4 is a top view illustrating another example of a wiring board of an embodiment of the present invention.
Figure 5:
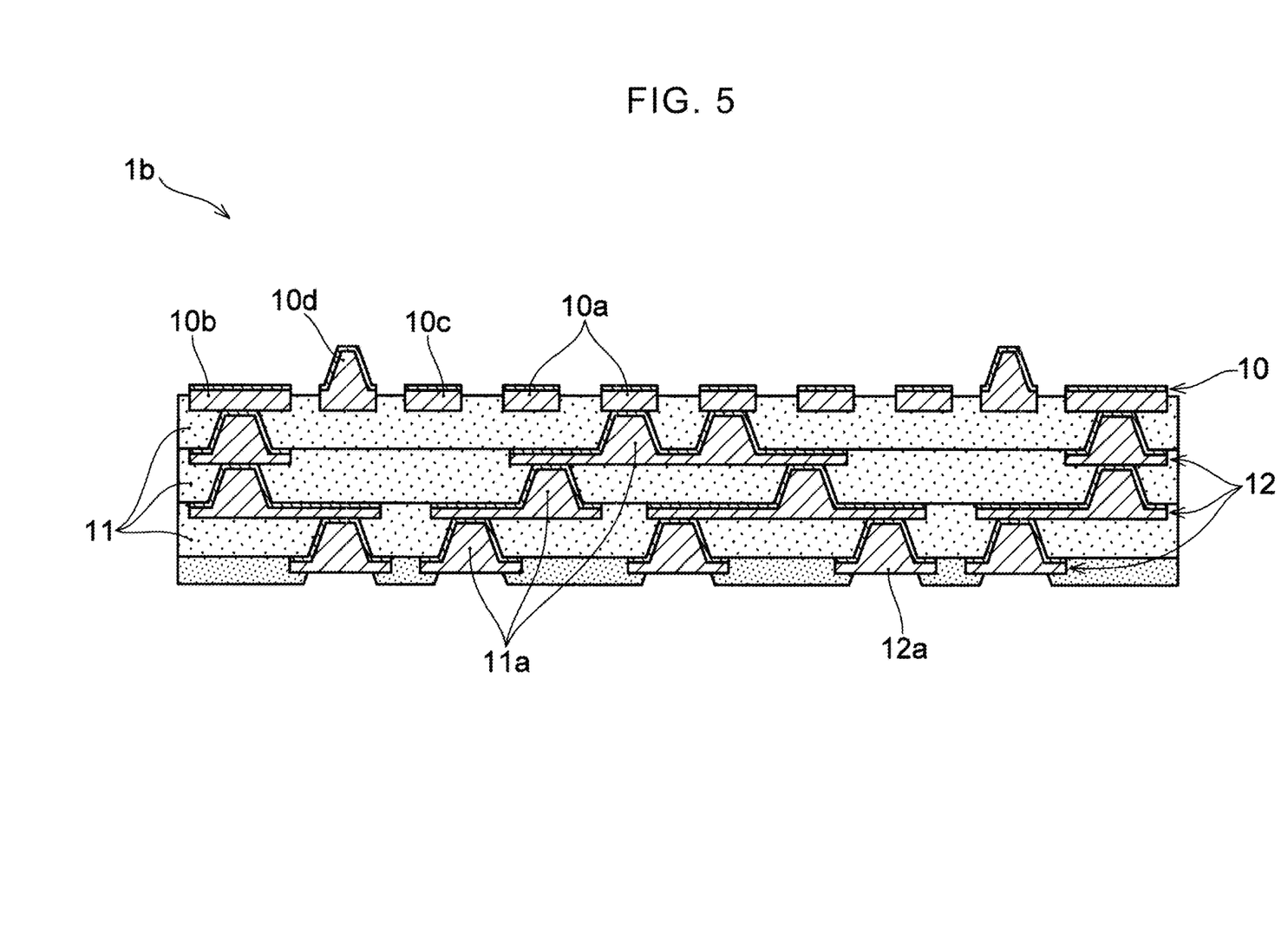
FIG. 5 is a cross-sectional view along a V-V line of the wiring board illustrated in FIG. 4.

Next, with reference to FIGS. 4 and 5, another example of a wiring board, which is an embodiment, is described. Different from the wiring boards (1, 1a), a wiring board (1b) illustrated in FIGS. 4 and 5 has a second protruding part (10d). The second protruding part (10d) is provided between the first protruding part (10c) and the second connection pads (10b), and is formed so as to surround the first protruding part (10c) in a frame shape. Similar to the first protruding part (10c), for example, when an electronic component such as a semiconductor IC chip is connected to the first connection pads (10a) by flip-chip mounting, the second protruding part (10d) functions as a dam that prevents an underfill material or the like filled in a gap between the electronic component connected to the first connection pads (10a) and the wiring board (1b) from flowing to an outer side of the region where the first connection pads (10a) are formed. The underfill material that has not been dammed by the first protruding part (10c) is dammed by the second protruding part (10d), and the underfill material is more reliably prevented from adhering to the second connection pads (10b).

An upper surface of the second protruding part (10d) is formed higher than the upper surfaces of the first connection pads (10a), the second connection pads (10b), and the first protruding part (10c) relative to the resin insulating layer 11, and the outflow of the underfill material can be more effectively prevented. The second protruding part (10d) is integrally formed with the first conductor layer 10. The second protruding part (10d) of the wiring board (1b) illustrated in FIG. 5 is formed in a shape that tapers toward a front end side (upper surface side). However, it is also possible that the second protruding part (10d) is formed in a shape having substantially the same width in the lamination direction.

The second protruding part (10d) is formed of the same material as the first connection pads (10a), the second connection pads (10b), and the first protruding part (10c) that form the first conductor layer 10. In the example illustrated in FIG. 5, the second protruding part (10d), the first connection pads (10a), the second connection pads (10b), and the first protruding part (10c) in the wiring board (1b) are each formed to have a two-layer structure including an electroless copper plating film layer and an electrolytic copper plating film layer.

In the wiring board (1b), the first protruding part (10c) and the second protruding part (10d) may be continuously integrated. That is, in the first conductor layer 10, it is also possible that the first protruding part (10c) and the second protruding part (10d) are seamlessly formed, and the resin insulating layer 11 is not exposed between the first protruding part (10c) and the second protruding part (10d). Due to lipophobicity of the surfaces of the first and second protruding parts (10c, 10d), it is possible that wetting and spreading of the underfill material can be more effectively suppressed.

Figure 6:
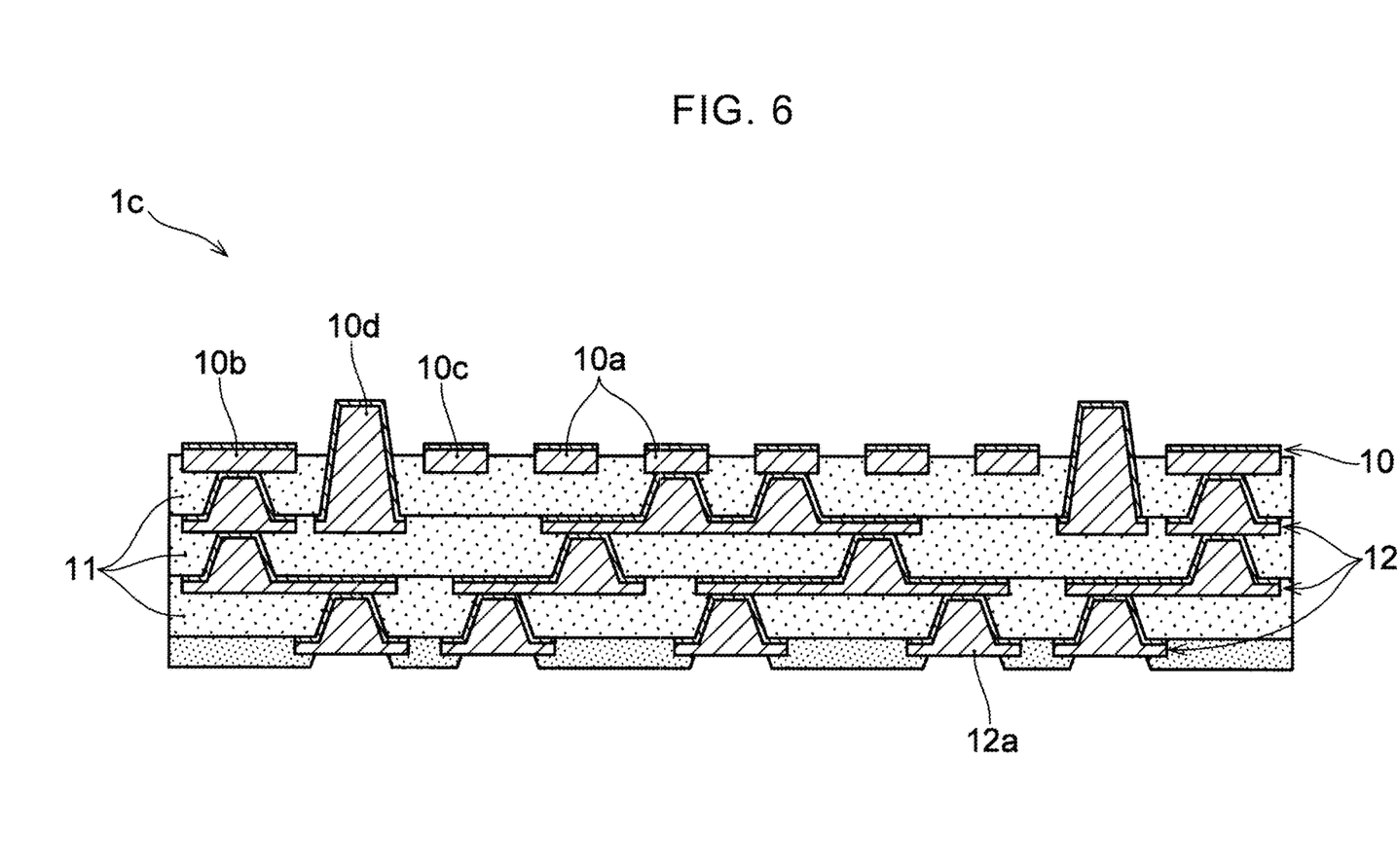
FIG. 6 is a cross-sectional view illustrating another example of the wiring board illustrated in FIG. 5.

FIG. 6 illustrates a wiring board (1c) in which the second protruding part (10d) is integrally formed with the second conductor layer 12. As compared to that in the wiring board (1b), the second protruding part (10d) in the wiring board (1c) is more deeply embedded in the resin insulating layer (1c). With such a structure, the second protruding part (10d) has a higher rigidity, and the occurrence of a defect such as a crack can be further suppressed. Other structural components of the wiring boards (1b, 1c) are the same as those of the wiring boards (1, 1a), and thus, a description thereof and display of reference numeral symbols thereof in the drawings are omitted as appropriate.

A protective film (not illustrated in the drawings) may be formed on the surface of each of the connection pads (the first connection pads (10a), the second connection pads (10b) and the third connection pads (12a)) and the protruding parts (the first protruding part (10c) and the second protruding part (10d)) in the wiring boards (1, 1a, 1b, 1c). For example, a protective layer formed of Ni/Pd/Au is provided. A protective layer may also be formed of Ni/Au or Sn. An OSP film may be formed by spraying an organic material. Further, the surfaces of the first protruding part (10c) and the second protruding part (10d) may be treated to impart lipophobicity so as to facilitate repelling of the underfill material.

Figure 7A:
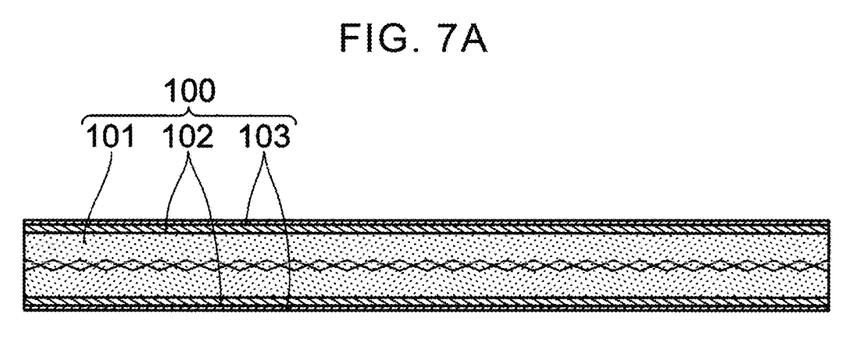
FIG. 7A illustrates a method for manufacturing a wiring board according to an embodiment of the present invention.
Figure 7B:
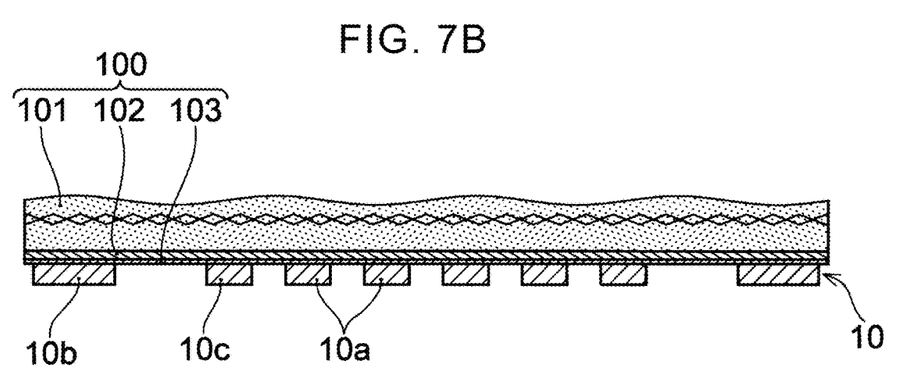
FIG. 7B illustrates the method for manufacturing the wiring board according to the embodiment of the present invention.

Next, a method for manufacturing the wiring board 1 illustrated in FIGS. 1 and 2 is described with reference to FIGS. 7A-7E. First, as illustrated in FIGS. 7A and 7B, the first conductor layer 10 including the first connection pads (10a), the second connection pads (10b) and the first protruding part (10c) is formed on a support plate 100. In FIG. 7A, both sides of the support plate 100 are illustrated. However, in FIG. 7B and later, only one side of the support plate 100 is illustrated, and illustration of a laminate formed on the other side is omitted. It is possible to use both sides or only one side of the support plate 100 for the formation of the wiring board 1. In FIGS. 7A-7E, it is not intended to illustrate exact ratios of thicknesses of the structural elements. In the description of the method for manufacturing the wiring board, a side far from the support plate 100 is referred to as "upper," "outer," "upper side," or "outer side."

As illustrated in FIG. 7A, the support plate 100 having a core material 101 and a metal foil 103 on a surface thereof is prepared. The metal foil 103 has a carrier metal foil 102 adhered to one surface thereof on the core material 101 side, and the carrier metal foil 102 and the core material 101 are bonded by thermal compression bonding or the like. The metal foil 103 and the carrier metal foil 102 are adhered to each other by, for example, a separable adhesive such as a thermoplastic adhesive, or are fixed to each other only at edges thereof. For the core material 101, for example, a glass epoxy substrate is used. It is also possible that a double-sided copper-clad laminated plate is used as the core material 101 having the carrier metal foil 102. The metal foil 103 and the carrier metal foil 102 are preferably each a copper foil.

Next, as illustrated in FIG. 7B, the first conductor layer 10 is formed on the support plate 100. For example, a plating resist (not illustrated in the drawings) is formed on the metal foil 103. The plating resist is provided with openings corresponding to patterns of the first and second connection pads (10a, 10b) and the first protruding part (10c) to be formed in the first conductor layer 10. Then, for example, an electrolytic copper plating film is formed in the openings of the plating resist by electrolytic plating of a metal material using the metal foil 103 as a seed layer, and thereafter, the plating resist is removed. The first conductor layer 10 (the first connection pads (10a), the second connection pads (10b), and the first protruding part (10c)) having the desired patterns is formed. The first protruding part (10c) is formed between the first connection pads (10a) and the second connection pads (10b) in a manner surrounding the region where the first connection pads (10a) are formed. The first conductor layer 10 may be formed using other methods such as electroless plating, or may be formed by sputtering, vacuum deposition, or the like.

Figure 7C:
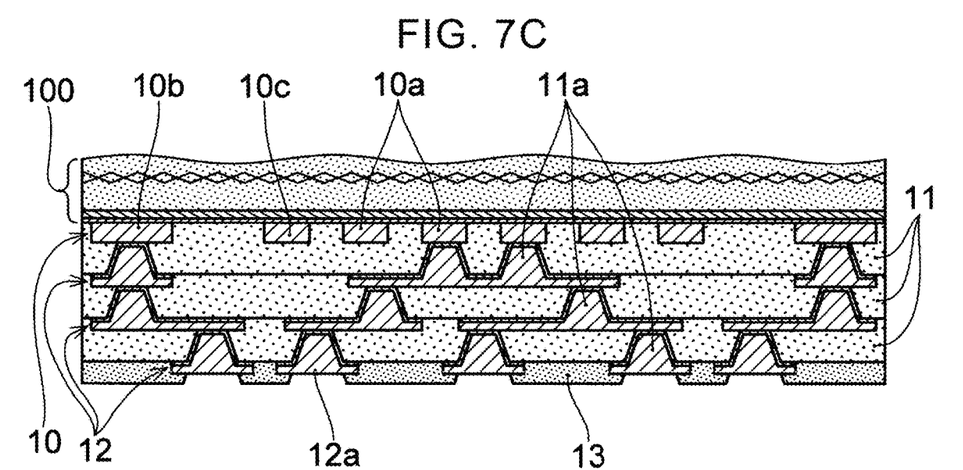
FIG. 7C illustrates the method for manufacturing the wiring board according to the embodiment of the present invention.

Further, as illustrated in FIG. 7C, the resin insulating layers 11 and the second conductor layers 12 are laminated on the support plate 100 and on the first conductor layer 10, and a laminate including the first conductor layer 10, the resin insulating layers 11, and the second conductor layers 12 is formed. For the lamination of the resin insulating layers 11 and the second conductor layers 12, an ordinal method for manufacturing a build-up wiring board can be used.

The resin insulating layer 11 in contact with the first conductor layer 10 is formed, for example, by thermocompression bonding of a film-like epoxy resin or the like onto the first conductor layer 10 and an exposed portion of the metal foil 103. The resin insulating layer 11 is formed so as to cover the first conductor layer 10 including the first connection pads (10a), the second connection pads (10b) and the first protruding part (10c) except for one side on the metal foil 103 side. After that, conduction holes penetrating the resin insulating layer 11 are formed in the resin insulating layer 11 at positions corresponding to formation positions of the via conductors (11a), for example, by irradiation with laser such as $CO_2$ laser or YAG laser.

Next, a metal film is formed on an inner side of each of the conduction holes and on a surface of the resin insulating layer 11, for example, by electroless plating. Further, using the metal film as a seed layer, an electrolytic plating film is formed using a pattern plating method. After that, a resist used for the pattern plating is removed, and the metal film exposed by the removal of the resist is removed by etching. As a result, the second conductor layer 12 having desired conductor patterns is formed on the resin insulating layer 11 formed in contact with the first conductor layer 10, on an opposite side with respect to the support plate 100. Further, the via conductors (11a) are integrally formed with the second conductor layer 12 in the conduction holes. In the manufacture of the wiring board 1, the formation of the resin insulating layer 11 and the second conductor layer 12 is repeated, and a laminate having the three resin insulating layers 11 and the three second conductor layers 12 is formed.

Next, the covering layer 13 is formed by forming a photosensitive epoxy resin or polyimide resin layer on surfaces of the second conductor layer 12 and the resin insulating layer 11. Then, using a photolithography technology, the openings exposing portions of the second conductor layer 12 covered by the covering layer 13 are formed, and the third connection pads (12a) are exposed from the openings.

Figure 7D:
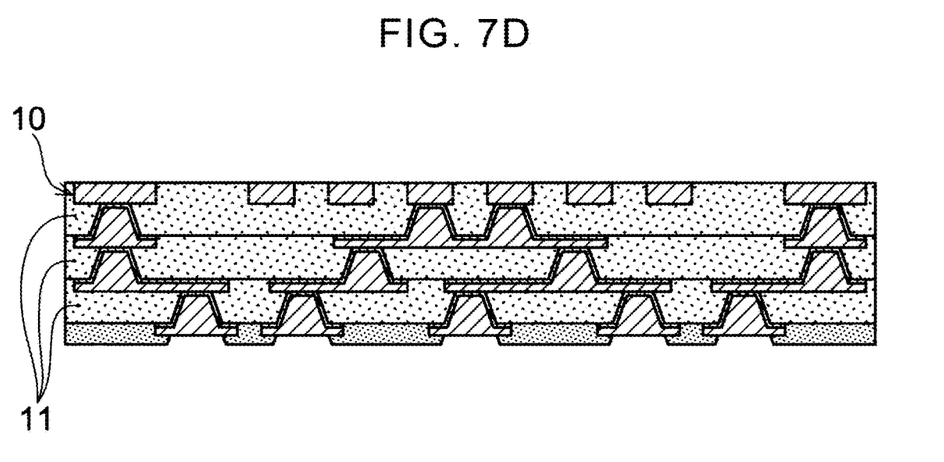
FIG. 7D illustrates the method for manufacturing the wiring board according to the embodiment of the present invention.

Next, the support plate 100 is removed. Specifically, the carrier metal foil 102 and the metal foil 103 are separated from each other, and the metal foil 103 exposed by the separation is removed, for example, by etching. The separation of the metal foil 103 and the carrier metal foil 102 can be performed, for example, by softening, by heating, the thermoplastic adhesive that adheres the two to each other, or by cutting off a joining portion where the two are fixed to each other at the edges thereof. By the removal of the support plate 100, as illustrated in FIG. 7D, the first conductor layer 10 and the resin insulating layer 11 are exposed.

Figure 7E:
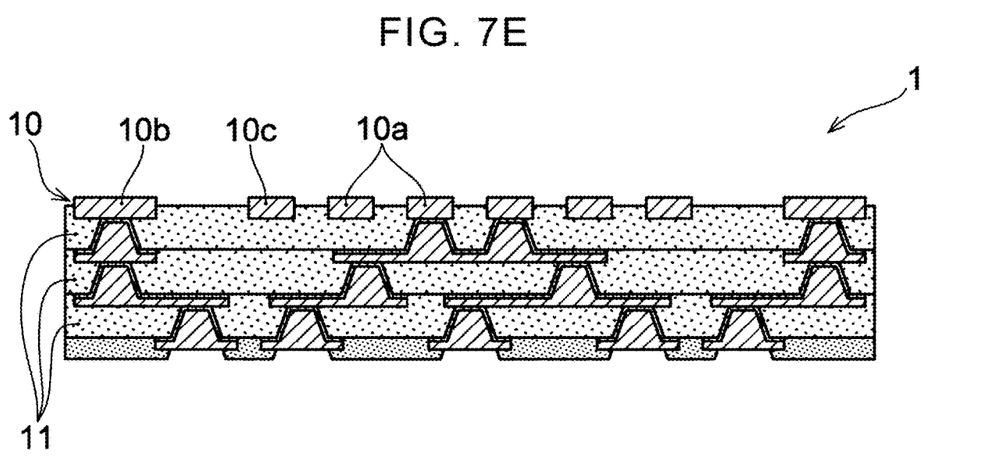
FIG. 7E illustrates the method for manufacturing the wiring board according to the embodiment of the present invention.

Next, as illustrated in FIG. 7E, by removing a portion in the thickness direction of the exposed resin insulating layer 11 by etching, the thickness of the resin insulating layer 11 is reduced, first conductor layer 10 is further exposed, and the first connection pads (10a), the second connection pads (10b) and the first protruding part (10c) protrude from the resin insulating layer 11. For the removal of the resin insulating layer 11, for example, a dry process such as plasma etching using $CF_4$ or $CF_4+O_2$ can be used. A portion of each of the first connection pads (10a), the second connection pads (10b) and the first protruding part (10c), which form the first conductor layer 10, is embedded in the resin insulating layer 11, and the rest protrudes from the resin insulating layer 11. By the above processes, the manufacture of the wiring board 1 is completed.

Next, a method for manufacturing the wiring board (1b) having the second protruding part (10d) is described with reference to FIGS. 8A-8D. When the wiring board (1b) is formed, a resin layer 110 is formed on a surface of the support plate 100. The resin layer 110 is formed in order for the second protruding part (10d) to be higher than the first conductor layer 10 in the manufacture of the wiring board (1b). In the resin layer 110 provided on the support plate 100, a through groove (10g) is formed using, for example, $CO_2$ laser or the like at a position where the second protruding part (10*d*) is formed. The through groove (10*g*) is formed between the position where the first protruding part (10*c*) of the first conductor layer 10 is formed and the region where the second connection pads (10*b*) are formed, and is formed so as to surround the first protruding part (10*c*) in a frame shape.

Figure 8A:
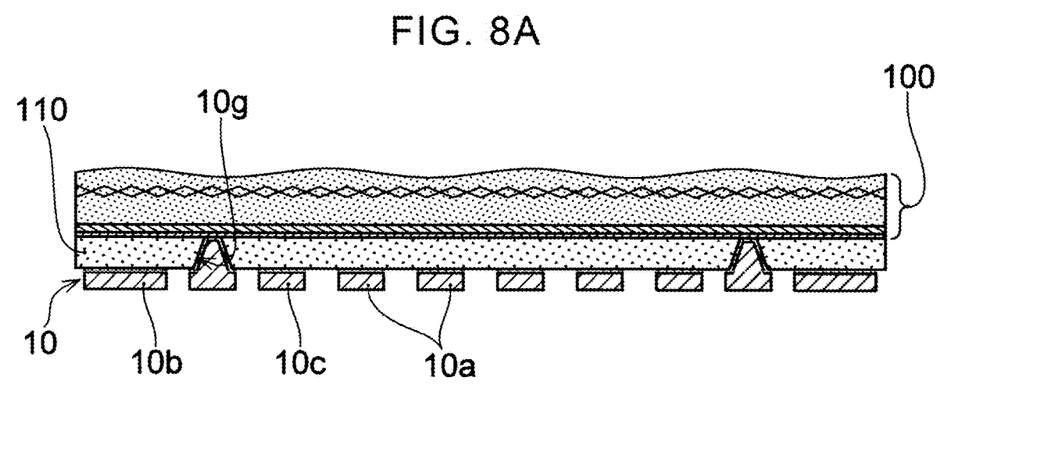
FIG. 8A illustrates a method for manufacturing a wiring board according to another embodiment of the present invention.

Next, the first conductor layer 10 and a conductor filling the through groove (10*g*) are integrally formed. Specifically, for example, an electroless plating film is formed on an inner side of the through groove (10*g*) formed in the resin layer 110 and on a surface of the resin layer 110, and, using a semi-additive method, the first connection pads (10*a*), the second connection pads (10*b*), the first protruding part (10*c*), and the conductor filling the through groove (log) are formed of the same conductive material.

Figure 8B:
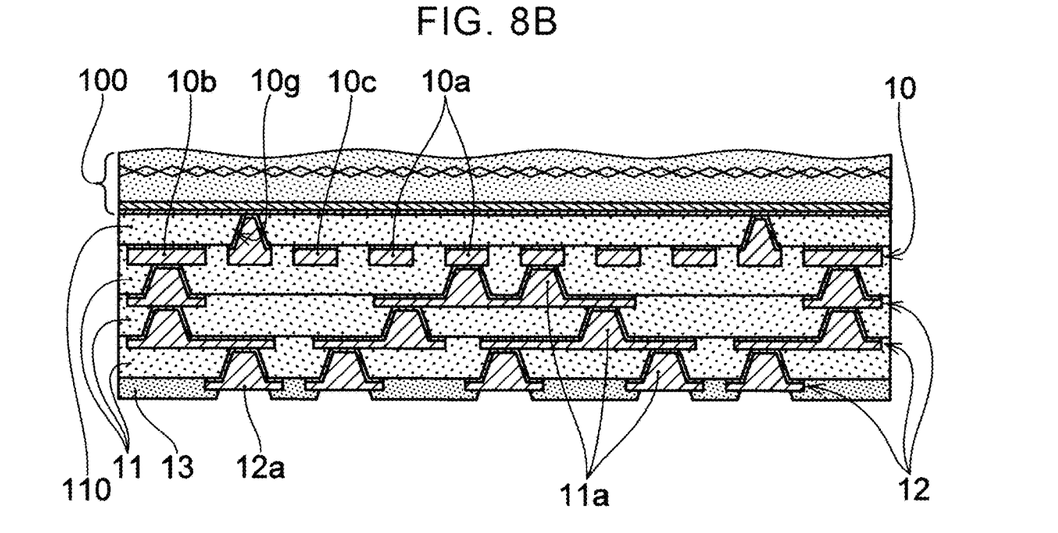
FIG. 8B illustrates the method for manufacturing the wiring board according to the other embodiment of the present invention.
Figure 8C:
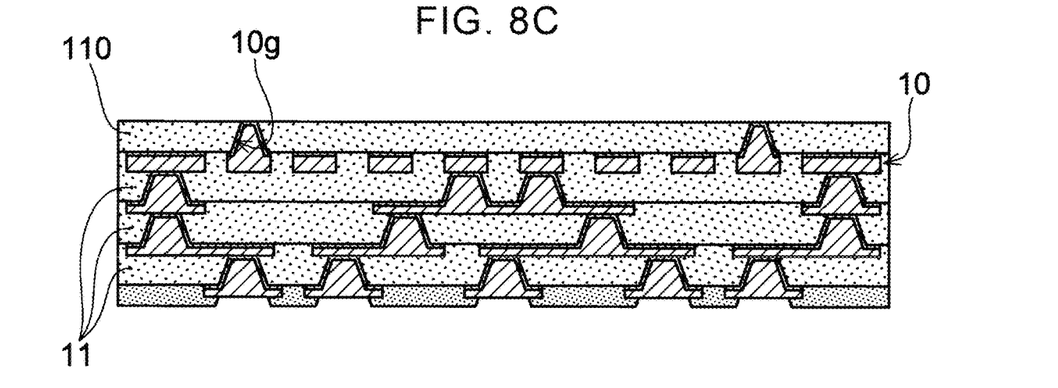
FIG. 8C illustrates the method for manufacturing the wiring board according to the other embodiment of the present invention.

Next, the resin insulating layer 11 is formed on the surfaces of the first conductor layer 10 and the resin layer 110 by thermocompression bonding of a film-like epoxy resin or the like. Then, the second conductor layer 12 and the via conductors (11*a*) are formed in the same manner as the process of forming the second conductor layer 12 and the via conductors (11*a*) in the manufacture of the wiring board 1 described above, and the three resin insulating layers 11 and the three second conductor layers 12 are laminated. Next, the covering layer 13 is formed, and, as illustrated in FIG. 8B, the laminate on one side of the support plate 100 is formed. After that, the support plate 100 is removed. The metal foil 103 is removed by etching, and, as illustrated in FIG. 8C, a surface of the conductor as the second protruding part (10*d*) and a surface of the resin layer 110 are exposed on a surface of the laminate.

Figure 8D:
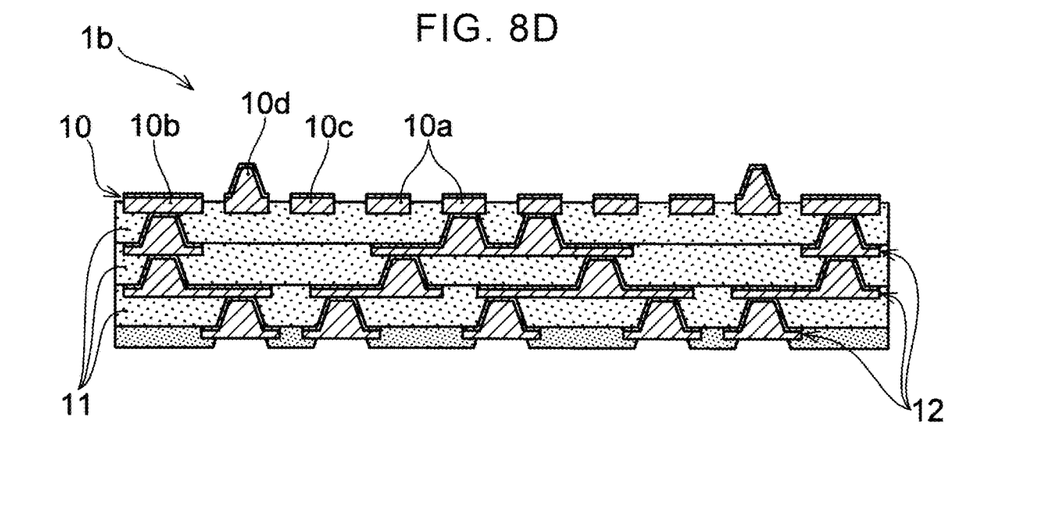
FIG. 8D illustrates the method for manufacturing the wiring board according to the other embodiment of the present invention.

As illustrated in FIG. 8D, for example, by plasma etching using CF$_4$ or CF$_4$+O$_2$, the resin layer 110 is completely removed, the conductor filling the through groove (log) is exposed, and the second protruding part (10*d*) is formed. Then, contiguously, a portion in the thickness direction of the resin insulating layer 11 formed in contact with the first conductor layer 10 is removed, and the first connection pads (10*a*), the second connection pads (10*b*) and the first protruding part (10*c*) are exposed and are in a state of protruding from the resin insulating layer 11, and the height of the second protruding part (10*d*) relative to the resin insulating layer 11 is further increased. As a result, the manufacture of the wiring board (1*b*) is completed.

When the wiring board (1*c*) illustrated in FIG. 6 is formed, at the stage of FIG. 8A, the through groove (10*g*) corresponding to the formation position of the second protruding part (10*d*) and the conductor filling the through groove (10*g*) are not formed. After the first conductor layer 10 and the resin insulating layer 11 in contact with the first conductor layer 10 are formed, when through holes are formed at the formation positions of the via conductors (11*a*), the frame-shaped through groove (10*g*) corresponding to the position where the second protruding part (10*d*) is formed is formed penetrating the resin insulating layer 11 and the resin layer 110. Then, at the same time as the formation of the second conductor layer 12 on an outer side of the resin insulating layer 11 in contact with the first conductor layer 10, a conductor is filled in the through groove (10*g*), and the conductor filling the through groove (10*g*) is integrally formed with the second conductor layer 12.

The process after the formation of the conductor filling the through groove (10*g*) when the wiring board (1*c*) is formed is the same as the manufacturing process of the wiring board (1*b*) described above. After the support plate 100 is removed, by removing the resin layer 110 and a portion of the resin insulating layer 11, the first connection pads (10*a*), the second connection pads (10*b*), the first protruding part (10*c*) and the second protruding part (10*d*) are exposed so as to protrude from the resin insulating layer 11, and the wiring board (1*c*) is completed.

When the wiring board (1*a*) illustrated in FIG. 3 is formed, in the manufacturing process of the wiring board (1*b*) described above, the process of forming the second protruding part (10*d*) is applied to the formation of the first protruding part (10*c*). In FIG. 8A, a through groove is formed at the position where the first protruding part (10*c*) is formed in the resin layer 110, and the through groove is filled with a conductor at the same time as the formation of the first conductor layer 10. In the formation of the wiring board (1*a*), the second protruding part (10*d*) surrounding the first protruding part (10*c*) is not formed. After the support plate 100 is removed, the entire resin layer 110 and a portion in the thickness direction of the resin insulating layer 11 are removed, and the wiring board (1*a*) is formed in which the height of the upper surface of the first protruding part (10*c*) relative to the resin insulating layer 11 is higher than that of the first and second connection pads (10*a*, 10*b*).

The wiring boards of the embodiments are not limited to those having the structures exemplified in the drawings, or the structures or materials exemplified in the present specification. For example, the first conductor layer 10 may include conductor patterns in addition to the first and second connection pads (10*a*, 10*b*) and first and second protruding parts (10*c*, 10*d*). The protruding parts may be formed to have a triple or quadruple frame structure, and additional protruding parts may be formed in addition to the first and second protruding parts (10*c*, 10*d*). The via conductors (11*a*) do not necessarily have to be reduced in diameter toward the first surface (1F) side. The wiring boards (1, 1*a*, 1*b*, 1*c*) may have any number of conductor layers and any number of insulating layers. The covering layer 13 does not have to be provided. Further, the methods for manufacturing the wiring boards of the embodiments are not limited to the methods described with reference to the drawings. Conditions, processing orders and the like of the methods may be appropriately modified. Depending on a structure of an actually manufactured printed wiring board, some of the processes may be omitted, or other processes may be added.

The flow prevention dam of the printed substrate of Japanese Patent Application Laid-Open Publication No. 2010-118634 is formed by over-curing a dry film resist which is a resin material, and thus is thought to have a low rigidity.

A wiring board according to an embodiment of the present invention has a component mounting surface formed by first connection pads, second connection pads, a first protruding part, and a resin insulating layer. The first protruding part is formed of a metal material between the first connection pads and the second connection pads in a manner surrounding a region where the first connection pads are provided, and a portion of the first protruding part is embedded in the resin insulating layer.

A method for manufacturing a wiring board according to an embodiment of the present invention includes: preparing a support plate, on a surface of which a metal foil is peelably provided; forming a first conductor layer including first connection pads and second connection pads on a surface of the support plate; forming a laminate by laminating a resin insulating layer on an upper side of the first conductor layer; removing the support plate from the laminate; and removing a portion of the resin insulating layer. The forming of the first conductor layer includes forming a first protruding part with a metal material between the first connection pads and the second connection pads in a manner surrounding a region where the first connection pads are formed, and the removing of the portion of the resin insulating layer includes causing the first connection pads, the second connection pads and the first protruding part to protrude from the resin insulating layer.

According to an embodiment of the present invention, rigidity of a protrusion that can function as a dam preventing an underfill material or the like from flowing out of a predetermined region is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a resin insulating layer having a component mounting surface;
   a conductor layer comprising a metal material and including a plurality of first connection pads,
   a plurality of second connection pads and a protruding part such that the plurality of first connection pads, the plurality of second connection pads and the protruding part are formed of a same material comprising the metal material; and
   a second protruding part formed on the component mounting surface of the resin insulating layer such that the second protruding part is surrounding the protruding part of the conductor layer
   and has an upper surface having a height that is higher than a height of an upper surface of the protruding part,
   wherein the plurality of first connection pads is formed on the component mounting surface of the resin insulating layer,
   the plurality of second connection pads is embedded in the component mounting surface of the resin insulating layer such that the plurality of second connection pads is surrounding the plurality of first connection pads and has a plurality of portions protruding from the component mounting surface of the resin insulating layer, respectively,
   and the protruding part is formed on the component mounting surface of the resin insulating layer such that a portion of the protruding part is embedded in the resin insulating layer
   and that the protruding part is positioned between the plurality of first connection pads and the plurality of second connection pads and surrounding the plurality of first connection pads.

2. The wiring board according to claim 1, wherein the plurality of first connection pads, the plurality of second connection pads and the protruding part are formed such that the first connection pads, second connection pads and protruding part have upper surfaces that are a same height relative to the component mounting surface of the resin insulating layer.

3. The wiring board according to claim 2, further comprising:
   a second conductor layer formed on a surface of the resin insulating layer on an opposite side with respect to the component mounting surface such that the second conductor layer includes the second protruding part.

4. The wiring board according to claim 2, wherein the conductor layer includes a layer of a metal plating material comprising the metal material, and the second protruding part includes a plurality of metal plating layers.

5. The wiring board according to claim 2, wherein the metal material of the protruding part, the first connection pads and second connection pads in the conductor layer is a metal plating material.

6. A coreless wiring board, comprising:
   the wiring board of claim 2 formed such that the wiring board does not have a core layer.

7. The wiring board according to claim 1, wherein the protruding part is formed such that the protruding part has an upper surface having a height that is higher than heights of upper surfaces of the first connection pads and second connection pads.

8. The wiring board according to claim 7, further comprising:
   a second conductor layer formed on a surface of the resin insulating layer on an opposite side with respect to the component mounting surface such that the second conductor layer includes the second protruding part.

9. The wiring board according to claim 8, wherein the conductor layer includes a layer of a metal plating material comprising the metal material, and the second protruding part includes a plurality of metal plating layers.

10. The wiring board according to claim 1, further comprising:
    a second conductor layer formed on a surface of the resin insulating layer on an opposite side with respect to the component mounting surface such that the second conductor layer includes the second protruding part.

11. The wiring board according to claim 1, wherein the conductor layer includes a layer of a metal plating material comprising the metal material, and the second protruding part includes a plurality of metal plating layers.

12. The wiring board according to claim 1, wherein the metal material of the protruding part, the first connection pads and second connection pads in the conductor layer is a metal plating material.

13. A coreless wiring board, comprising:
    the wiring board of claim 1 formed such that the wiring board does not have a core layer.

14. The wiring board according to claim 1, wherein the plurality of first connection pads is embedded in the component mounting surface of the resin insulating layer such that the plurality of first connection pads has a plurality of portions protruding from the component mounting surface of the resin insulating layer, respectively.

15. A method for manufacturing a wiring board, comprising:
    preparing a support plate comprising a metal foil;
    forming a laminate comprising a resin insulating layer, a conductor layer including a plurality of first connection pads, a plurality of second connection pads and a protruding part and a second protruding part such that the laminate comprising the resin insulating layer, the conductor layer and the second protruding part is formed on the support plate;
    removing the support plate from the laminate; and
    removing a portion of the resin insulating layer such that the plurality of first connection pads, the plurality of second connection pads, the protruding part and the second protruding part protrude from a surface of the resin insulating layer,
    wherein the forming of the laminate includes forming the protruding part between the plurality of first connection pads and the plurality of second connection pads such that the protruding part surrounds the plurality of first connection pads and that the second protruding part is surrounding the protruding part of the conductor layer and has an upper surface having a height that is higher than a height of an upper surface of the protruding part, and the conductor layer is formed such that the plurality of first connection pads, the plurality of second connection pads and the protruding part are formed of a same material comprising a metal material.

16. The method for manufacturing a wiring board according to claim 15, wherein the forming of the laminate includes forming a resin layer on a surface of the metal foil of the support plate, forming the conductor layer forming a through groove in the resin layer at a position where the protruding part of the conductor layer is formed and removing the resin layer from the laminate after the removing of the support plate such that the protruding part is formed, and the forming of the conductor layer includes filling the through groove formed in the resin layer with a conductor and forming the first and second connection pads at the same time.

17. The method for manufacturing a wiring board according to claim 16, wherein the removing of the portion of the resin insulating layer includes further increasing a height of the protruding part relative to the surface of the resin insulating layer.

18. The method for manufacturing a wiring board according to claim 16, wherein the forming of the laminate includes forming a resin layer on a surface of the metal foil of the support plate, forming the conductor layer forming a through groove in the resin layer at a position where the through groove surrounds the protruding part filling the through groove with a conductor and removing the resin layer from the laminate after the removing of the support plate such that the second protruding part is formed on a component mounting surface of the resin insulating layer, and the filling of the through groove and the forming of the conductor layer are conducted at the same time.

19. The method for manufacturing a wiring board according to claim 18, wherein the removing of the portion of the resin insulating layer includes further increasing a height of the second protruding part relative to a surface of the resin insulating layer.

20. A wiring board, comprising:

a resin insulating layer having a component mounting surface; and a conductor layer comprising a metal material and including a plurality of first connection pads, a plurality of second connection pads, a first protruding part and a second protruding part such that the plurality of first connection pads, the plurality of second connection pads, the first protruding part and the second protruding part are formed of a same material comprising the metal material, wherein the plurality of first connection pads is formed on the component mounting surface of the resin insulating layer, the plurality of second connection pads is formed on the component mounting surface of the resin insulating layer such that the plurality of second connection pads is surrounding the plurality of first connection pads, the first protruding part is formed on the component mounting surface of the resin insulating layer such that a portion of the first protruding part is embedded in the resin insulating layer and that the first protruding part is positioned between the plurality of first connection pads and the plurality of second connection pads and surrounding the plurality of first connection pads, the second protruding part is formed on the component mounting surface of the resin insulating layer such that the second protruding part is surrounding the first protruding part and that the second protruding part has an upper surface having a height that is higher than a height of an upper surface of the first protruding part, and the plurality of first connection pads, the plurality of second connection pads and the first protruding part are formed such that upper surfaces of the first connection pads and second connection pads and the upper surface of the first protruding part are a same height relative to the component mounting surface of the resin insulating layer.

\* \* \* \* \*